(12) United States Patent
Kim et al.

(10) Patent No.: US 9,991,113 B2
(45) Date of Patent: Jun. 5, 2018

(54) SYSTEMS AND METHODS FOR FABRICATING SINGLE-CRYSTALLINE DIAMOND MEMBRANES

(71) Applicants: Jeehwan Kim, Cambridge, MA (US); Dirk Robert Englund, Cambridge, MA (US); Mark A. Hollis, Concord, MA (US); Travis Wade, Harvard, MA (US); Michael Geis, Acton, MA (US); Richard Molnar, Harvard, MA (US)

(72) Inventors: Jeehwan Kim, Cambridge, MA (US); Dirk Robert Englund, Cambridge, MA (US); Mark A. Hollis, Concord, MA (US); Travis Wade, Harvard, MA (US); Michael Geis, Acton, MA (US); Richard Molnar, Harvard, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days. days.

(21) Appl. No.: 15/613,396

(22) Filed: Jun. 5, 2017

(65) Prior Publication Data

US 2017/0352538 A1    Dec. 7, 2017

Related U.S. Application Data

(60) Provisional application No. 62/345,403, filed on Jun. 3, 2016.

(51) Int. Cl.
*H01L 21/20*     (2006.01)
*H01L 21/02*     (2006.01)
(Continued)

(52) U.S. Cl.
CPC .... *H01L 21/02527* (2013.01); *H01L 21/0245* (2013.01); *H01L 21/0262* (2013.01);
(Continued)

(58) Field of Classification Search
CPC ................ H01L 21/02527; H01L 21/02326
See application file for complete search history.

(56) References Cited

U.S. PATENT DOCUMENTS 5,114,745 A    5/1992  Jones
5,308,661 A    5/1994  Feng et al.
(Continued)

FOREIGN PATENT DOCUMENTS

WO    WO 2016/058037 A1    4/2016

OTHER PUBLICATIONS

A. C. Diebold, S. W. Steinhauser, R. P. Mariella, J. Marti, F. Reidinger, and R. F. Antrim, Growth and characterization of GaAs on Sapphire (0001) by molecular Bbam epitaxy, Surf. Int. Anal., 15, 150-158 (1990).
(Continued)

*Primary Examiner* — Julio J Maldonado
*Assistant Examiner* — Andre' C Stevenson
(74) *Attorney, Agent, or Firm* — Cooley LLP

(57) ABSTRACT

A buffer layer is employed to fabricate diamond membranes and allow reuse of diamond substrates. In this approach, diamond membranes are fabricated on the buffer layer, which in turn is disposed on a diamond substrate that is lattice-matched to the diamond membrane. The weak bonding between the buffer layer and the diamond substrate allows ready release of the fabricated diamond membrane. The released diamond membrane is transferred to another substrate to fabricate diamond devices, while the diamond substrate is reused for another fabrication.

18 Claims, 10 Drawing Sheets

(51) Int. Cl.

| | | |
|---|---|---|
| *H01L 21/306* | (2006.01) | |
| *H01L 21/3213* | (2006.01) | |
| *H01L 21/683* | (2006.01) | |
| *H01L 29/04* | (2006.01) | |
| *H01L 29/16* | (2006.01) | |

(52) U.S. Cl.
CPC .. *H01L 21/02376* (2013.01); *H01L 21/02444* (2013.01); *H01L 21/02598* (2013.01); *H01L 21/02645* (2013.01); *H01L 21/30604* (2013.01); *H01L 21/32133* (2013.01); *H01L 21/6835* (2013.01); *H01L 29/04* (2013.01); *H01L 29/1602* (2013.01); *H01L 2221/68363* (2013.01); *H01L 2221/68381* (2013.01); *H01L 2221/68386* (2013.01)

(56) References Cited

U.S. PATENT DOCUMENTS

| | | | |
|---|---|---|---|
| 5,349,922 | A | 9/1994 | Anthony et al. |
| 5,527,559 | A | 6/1996 | Simpson |
| 5,792,254 | A | 8/1998 | Windischmann |
| 8,906,772 | B2 * | 12/2014 | Sumant ............ H01L 21/02376 257/E21.007 |
| 8,916,451 | B2 | 12/2014 | Bayram et al. |
| 9,096,050 | B2 | 8/2015 | Bedell et al. |
| 2009/0162549 | A1 | 6/2009 | Fryda et al. |
| 2012/0141799 | A1 | 6/2012 | Kub et al. |
| 2015/0084074 | A1 | 3/2015 | Bayram et al. |
| 2016/0333472 | A1 | 11/2016 | Xu et al. |

OTHER PUBLICATIONS

A. Koma, K. Sunouchi, and T. Miyajima, Fabrication and characterization of heterostructures with subnanometer thickness Microelectronic Eng. 2, 129-136 (1984).

A. Koma, Van der Waals epitaxy for highly lattice-mismatched systems, J. Cryst. Growth. 201-202, 236-241 (1999).

A. T. Barton, R. Yuea, S. Anwar, H. Zhu, X. Peng, S. McDonnell, N. Lu, R. Addou, L. Colombo, M.J. Kim, R.M. Wallace, and C.L. Hinkle, Transition metal dichalcogenide and hexagonal boron nitride heterostructures grown by molecular beam epitaxy. Microelec. Eng. 147, 306-309 (2015).

B. M. Kayes, L. Zhang, R. Twist, I.-K. Ding, and G. S. Higashi, Flexible thin-film tandem solar cells with >30% efficiency, IEEE J. Photovolt. 4, 729-733 (2014).

C. A. O. Henning, Orientation of vacuum condensed overgrowths through amorphous layers, Nature 227, 1130-1131 (1970).

C. Berger, Z. Song, T. Li, X. Li, A. Y. Ogbazghi, R. Feng, Z. Dai, A. N. Marchenkov, E. H. Conrad, P. N. First, and W. A. de Heer, Ultrathin epitaxial graphite: 2D electron gas properties and a route toward graphene-based nanoelectronics. J. Phys. Chem. B 108, 19912-19916 (2004).

C.-W. Cheng, K.-T. Shiu, N. Li, S.-J Han, L. Shi, and D.K. Sadana, Epitaxial lift-off process for gallium arsenide substrate reuse and flexible electronics. Nat. Commun. 4, 1577 DOI: 10.1038/ncomms2583, 7 pages (2013).

C.-Y. Lee, Y.-P. Lan, P.-M. Tu, S.-C. Hsu, C.-C. Lin, H.-C. Kuo, G.-C. Chi, and C.-Y. Chang, Natural substrate lift-off technique for vertical light-emitting diodes, Appl. Phys. Exp. 7, 042103-1-4 (2014).

D. Iida, S. Kawai, N. Ema, T. Tsuchiya, M. Iwaya, T. Takeuchi, S. Kamiyama, and I. Akasaki, Laser lift-off technique for freestanding GaN substrate using an In droplet formed by thermal decomposition of GaInN and its application to light-emitting diodes, Appl. Phys. Lett. 105, 072101-1-4 (2014).

D. Shahrjerdi, S. W. Bedell, C. Bayram, C. C. Lubguban, K. Fogel, P. Lauro, J. A. Ott, M. Hopstaken, M. Gayness, and D. Sadana, "Ultra-light high-efficiency flexible tandem InGaP/(In)GaAs solar cells", Advanced Energy Materials, 3, 566-571 (2013).

D. Shahrjerdi, S. W. Bedell, Extremely bendable nanoscale ultra thin body silicon integrated circuit on plastic, Nano Lett. 13, 315-320 (2013).

E. Yablonovitch, T. Gmitter, J. P. Harbison, and R. Bhat, Extreme selectivity in the lift-off of epitaxial GaAs films. Appl. Phys. Lett. 51, 2222-2224 (1987).

G. I. Distler and E. I. Tokmakova, Oriented crystallization of AgCl on amorphous polyvinyl chloride replicas of NaCl single crystal surfaces, Thin Solid Films, 6, 203-2011 (1970).

G. I. Distler and L. A. Shenyayskaya, Polarization Structure of Interfacial Amorphous Films, Nature 221, 52-53 (1969).

G. I. Distler, The real structure of crystals and selective nucleation at surface local long range active centres, J. Cryst. Growth, 3, 175-179 (1968).

G. Wang, M. Zhang, Y. Zhu, G. Ding, D. Jiang, Q. Guo, S. Liu, X. Xie, P. K. Chu, Z. Di, and X. Wang, Direct growth of graphene film on germanium substrate, Sci. Rep. 3, 2465, DOI: 10.1038/srep02465, 6 pages (2013).

J. Adams, V. Elarde, A. Hains, C. Stender, F. Tuminello, C. Youtsey, A. Wibowo, and M. Osowski, Demonstration of multiple substrate reuses for inverted metamorphic solar cells, IEEE J. Photovolt. 3, 899 (2013).

J. Kim and Y.-H. Xie, The fabrication of dislocation-free tensile strained Si thin films using controllably oxidized porous Si substrates, Appl. Phys. Lett., 89, 152117-1-3 (2006).

J. Kim, A. Hong, B. Chandra, G. Tulevski, and D. Sadana, "Engineering of contact resistance between transparent single-walled carbon nanotube films and a-Si:H single junction solar cells by gold nanodots", Advanced Materials, vol. 24, 1899-1902 (2012).

J. Kim, Biyun Li, and Ya-Hong Xie, "A method for fabricating dislocation-free tensile-strained SiGe films via the oxidation of porous Si substrates", Applied Physics Letters, vol. 91, 252108-1-3 (2007).

J. Kim, C. Battaglia, M. Charrière, A. Hong, W. Jung, H. Park, C. Ballif, and D. Sadana, "9.4% efficient three-dimensional amorphous silicon solar cells on high aspect-ratio glass microcones", Advanced Materials, vol. 26, 4082-4086 (2014).

Kim, C. Bayram, H. Park, C.-W. Cheng, C. Dimitrakopoulos, J. A. Ott, K. B. Reuter, S. W. Bedell, and D. Sadana, Principle of direct van der Waals epitaxy of single-crystalline films on epitaxial graphene, Nat. Commun. 5, 4836, DOI: 10.1038/ncomms5836, 7 pages (2014).

J. Kim, H. Hiroi, T. K. Todorov, O. Gunanwan, M. Kuwahara, T. Gokmen, D. Nair, M. Hopstaken, B. Shin, H. Sugimoto, and D. Mitzi, "High-efficiency Cu2ZnSn(S,Se)4 solar cells by applying a double In2S3/CdS emitter" Advanced Materials, vol. 26, 7427-7431 (2014).

J. Kim, H. Park, J. B. Hannon, S. W. Bedell, K. Fogel, D. K. Sadana, and C. Dimitrakopoulos, Layer-resolved graphene transfer via engineered strain layers, Science,342, 833-836 (2013).

J. Kim, Z. Hong, G. Li, T.-B. Song, J. Chey, D. Sadana, and Y. Yang, "10.5% amorphous silicon/polymer tandem photovoltaic cell", Nature Communications, vol. 6, 6391, DOI: 10.1038/ncomms7391, 6 pages (2015).

J.-H. Lee, E. K. Lee, W.-J. Joo, Y. Jang, B.-S. Kim, J. Y. Lim, S.-H. Choi, S. J. Ahn, J. R. Ahn, M-H Park, C.-W. Yang, B. L. Choi, S.-W Hwang, and D. Whang, Wafer-scale growth of single-crystal monolayer graphene on reusable hydrogen-terminated germanium, Science 344, 286-289 (2014).

Jason Greaving, Fabrication and Characterization of Diamond Thin Films as Nanocarbon Transistor Substrates, Master's Thesis, Vanderbilt University, 48 pages (2013).

K. Ait-Mansour, D. Dentel, L. Kubler, M. Diani, J.L. Bischoff, and A. Galliano, Ge epitaxial island growth on a graphitized C-rich 4H-SiC(0001) surface, J. Cryst. Growth, 275, 2275-2280 (2005).

K. Chung, C.-H. Lee, and G.-C. Yi, Transferable GaN layers grown on ZnO-coated graphene layers for optoelectronic devices. Science, 330, 655-657 (2010).

K. Lee, J. D. Zimmerman, X. Xiao, K. Sun, and S. R. Forrest, Reuse of GaAs substrates for epitaxial lift-off by employing protection layers, J. Appl. Phys. 111, 033527-1-6 (2012).

(56) References Cited

OTHER PUBLICATIONS

K. Ueno, K. Saiki, T. Shimada, and A. Koma, Epitaxial-growth of transition-metal dichalcogenides on cleaved faces of mica, J. Vac. Sci. Technol. A, 8, 68-72 (1990).

K. V. Emtsev, A. Bostwick, K. Horn, J. Jobst, G. L. Kellogg, L. Ley, J. L. McChesney, T. Ohta, S. A. Reshanov, J. Rührl, E. Rotenberg, A. K. Schmid, D. Waldmann, H. B. Weber, and T. Seyller, Towards wafer-size graphene layers by atmospheric pressure graphitization of silicon carbide. Nat. Mater. 8, 203207 (2009).

L. B. Freund and S. Suresh, Thin film materials: stress, defect formation and surface evolution, Cambridge Univ. Press, 820 pages (2009).

M. Thouless, A. Evans, M. Ashby, and J. Hutchison, The edge cracking and spalling of brittle materials, Acta metall., 35, 1333-1341 (1987).

P. Avouris and C. Dimitrakopoulos, Graphene: synthesis and applications. Materials Today 15, 86, 12 pages (2012).

R. Schlar, D. Louder, O. Lang, C. Pettenkofer, W. Jaegermann, K. W. Nebesny, P. A. Lee, B. A. Parkinson, and N. R. Armstrong, Molecular beam epitaxy growth of thin films of SnS2 and SnSe2 on cleaved mica and the basal planes of single-crystal layered semiconductors: Reflection high-energy electron diffraction, low-energy electron diffraction, photoemission, and scanning tunneling microscopy/atomic force microscopy characterization, J. Vac. Sci. Technol. A, 13, 1761-1767 (1995).

R.S. Balmer et al., Chemical vapour deposition synthetic diamond: materials, technology and applications, J Phys Condens Matter, 21(36):364221, 51 pages (Aug. 19, 2009).

S. Nakamura. GaN Growth Using GaN Buffer Layer. Jap. J. Appl. Phys., 30, 1705-1707 (1991).

S. Tanaka, K. Morita, and H. Hibino, Anisotropic layer-by-layer growth of graphene on vicinal SiC(0001) surfaces. Phys. Rev. B 80, 121406R-4 (2009).

S. Vishwanath, X. Liu, S. Rouvimov, L. Basile, N. Lu, A. Azcatl, K. Magno, R. M. Wallace, M. Kim, J.-C. Idrobo, J. K. Furdyna, D. Jena, and H. G. Xing, Controllable growth of layered selenide and telluride heterostructures and superlattices using molecular beam epitaxy. J. Mater. Res., 31, 7, 11 pages (2016).

S. W. Bedell, C. Bayram, K. Fogel, P. Lauro, J. Kiser, J. Ott, Y. Zhu, and D. Sadana, Vertical light-emitting diode fabrication by controlled spalling, Appl. Phys. Exp. 6, 112301-1-4 (2014).

S. W. Bedell, D. Shahrjerdi, B. Hekmatshoar, K. Fogel, P. Lauro, J. Ott, N. Sosa, and D. Sadana, Kerf-Less Removal of Si, Ge, and III—V Layers by Controlled Spalling to Enable Low-Cost PV Technologies, IEEE J. Photovol., 2, 141-147 (2012).

S. W. Bedell, K. Fogel, P. Lauro, D. Shahrjerdi, J. Ott, and D. Sadana, Layer transfer by controlled spalling. J. Phys. D: Appl. Phys. 46, 152002, 6 pages (2013).

T. Loher, Y. Tomm, C. Pettenkofer, and W. Jaegermann, Van der Waals epitaxy of three-dimensional CdS on the two-dimensional layered substrate MoTe2 (0001). Appl. Phys. Lett. 65, 555-557 (1994).

T. Ueda, M. Ishida, and M. Yuri, Separation of thin GaN from sapphire by laser lift-off technique, Jap. J. of Appl. Phys. 50, 041001-1-5 (2011).

W. A. de Heera, C. Bergera, X. Wu, P. N. First, E. H. Conrad, X. Li, T. Li, M. Sprinkle, J. Hass, M. L. Sadowski, M. Potemski, and G. Martinez, Epitaxial graphene, Solid State Communications 143 (1-2), 92-100 (2007).

Y. Alaskar, S. Arafin, Q. Linc, D. Wickramaratne, J. McKay, A. G. Norman, Z. Zhang, L. Yao, F. Ding, J. Zou, M. S. Goorsky, R. K. Lake, M. A. Zurbuchen, and K. L. Wang, Theoretical and experimental study of highly textured GaAs on silicon using a graphene buffer layer, J. of Cryst. Growth, 425, 268-273 (2015).

Y. Kobayashi, K. Kumakura, T. Akasaka, and T. Makimoto, Layered boron nitride as a release layer for mechanical transfer of GaN-based devices, Nature, 484, 223-227 (2012).

Y.-C. Lin, N. Lu, N. Perea-Lopez, J. Li, Z. Lin, X. Peng, C. H. Lee, C. Sun, L. Calderin, P. N. Browning, M. S. Bresnehan, M. J. Kim, T. S. Mayer, M. Terrones, and J. A. Robinson, Direct synthesis of van der Waals solids, ACS Nano, 8, 3715-3723 (2014).

Z. Suo and J. Hutchinson, Steady-state cracking in brittle substrates beneath adherent films, J. Solid Structures 25, 1337-1353 (1989).

International Search Report and Written Opinion dated Dec. 21, 2017 for International Application No. PCT/US17/35954, 8 pages.

\* cited by examiner

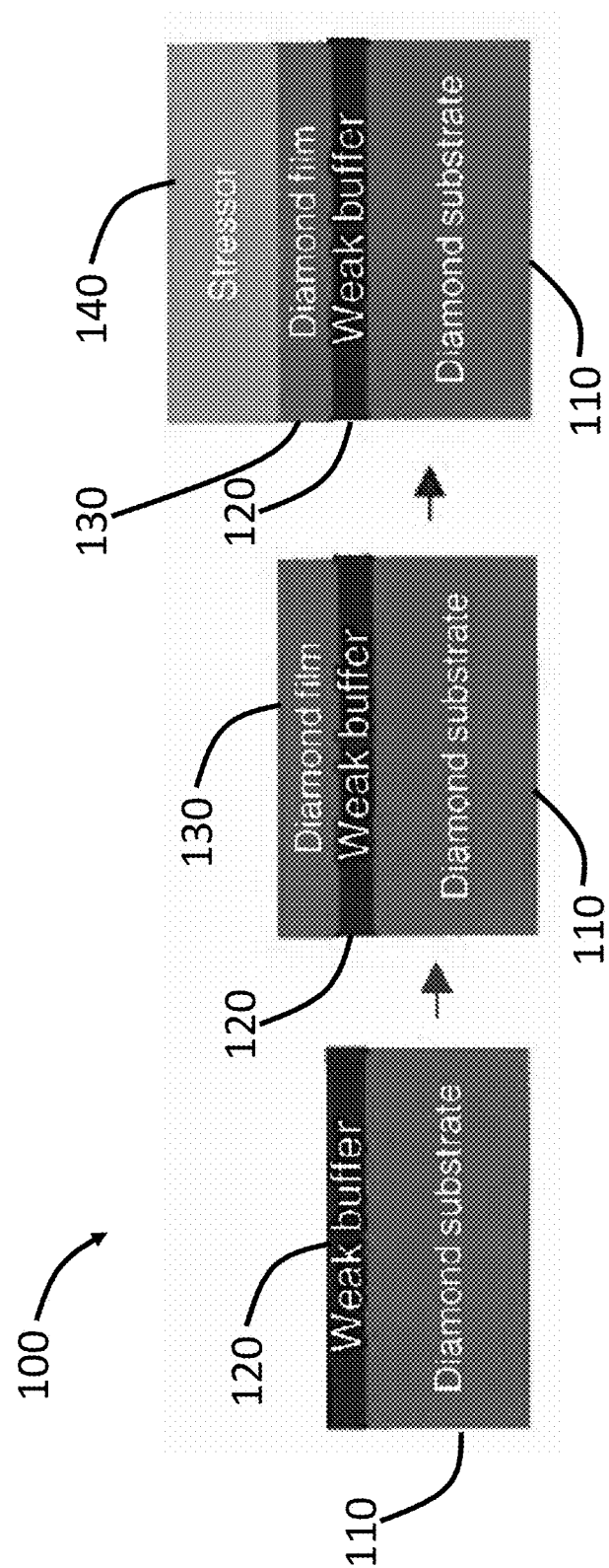

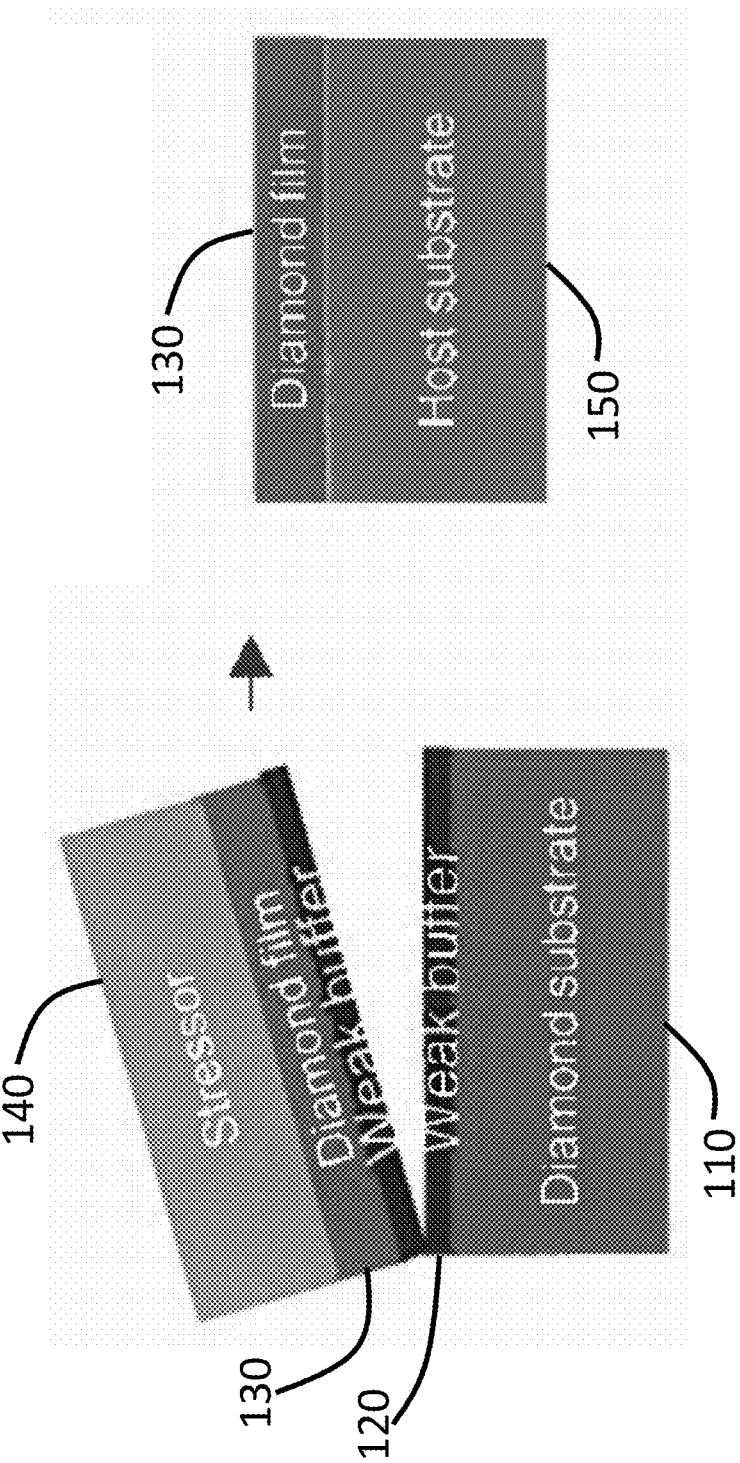

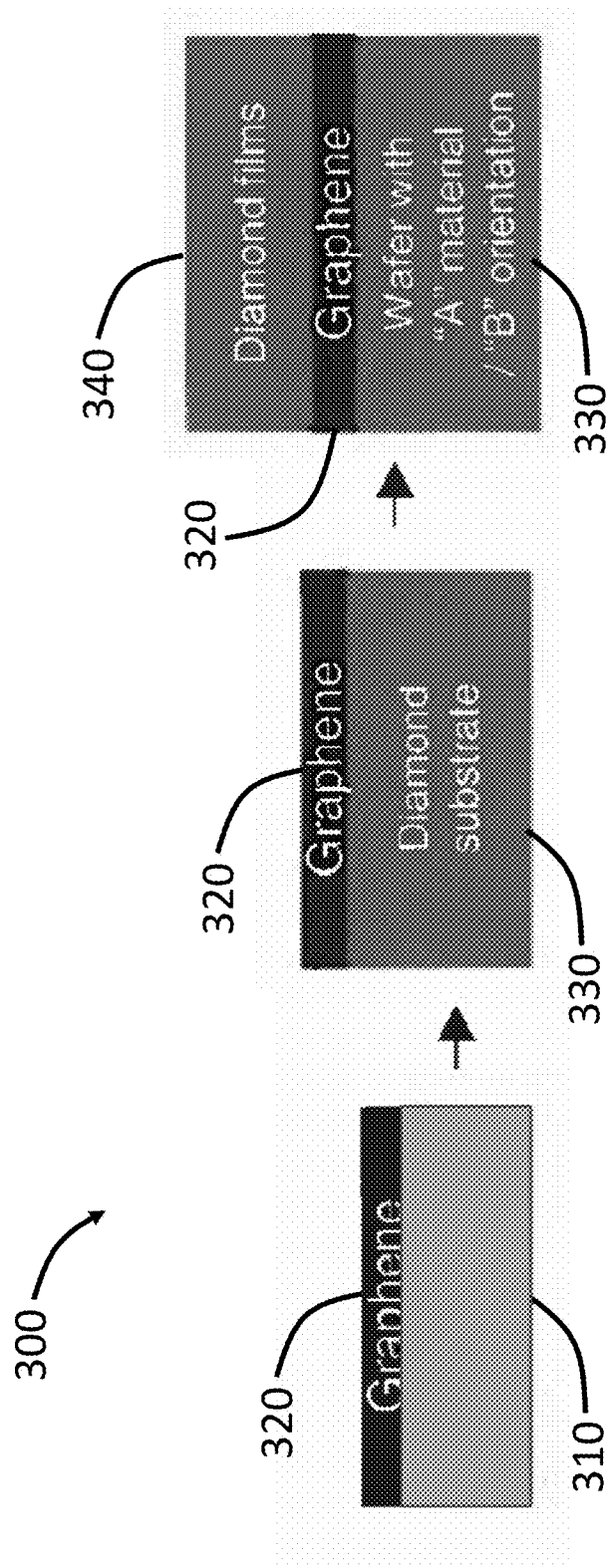

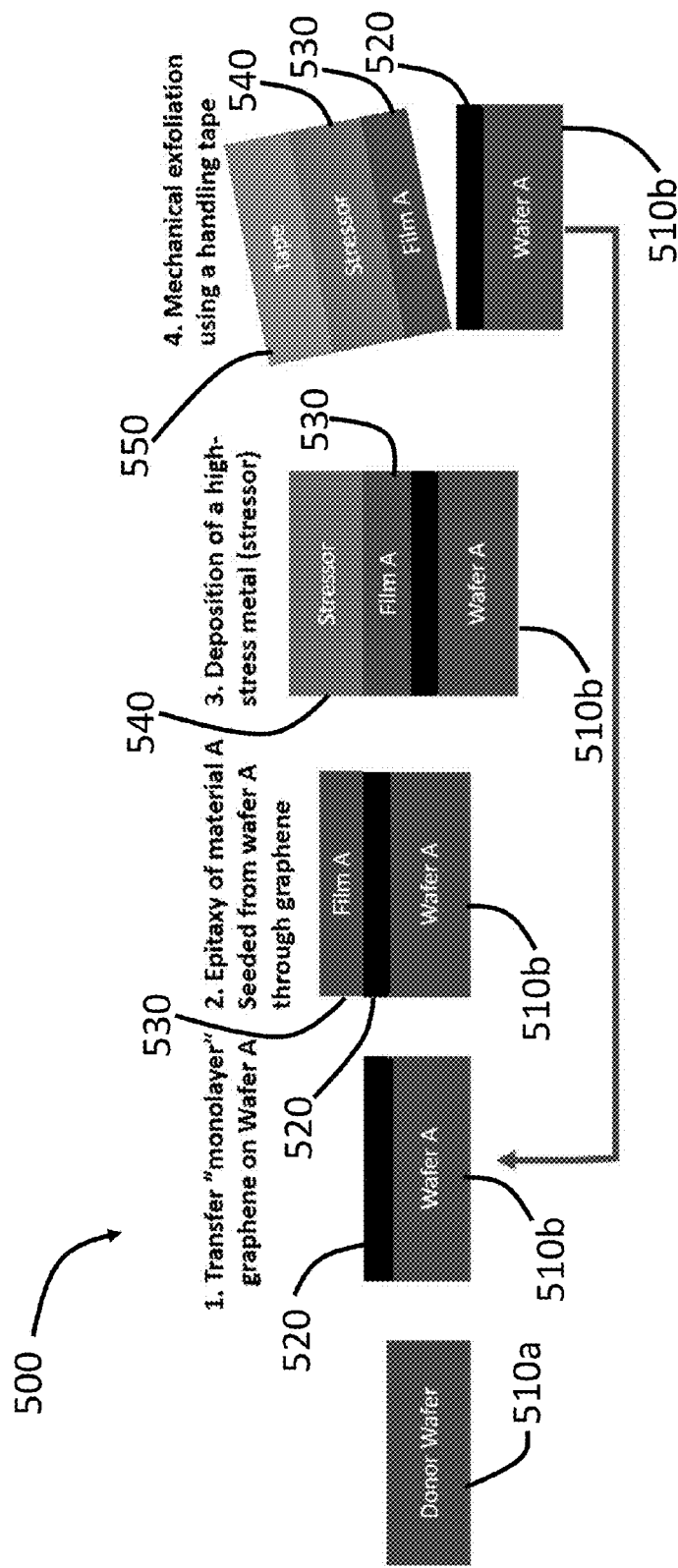

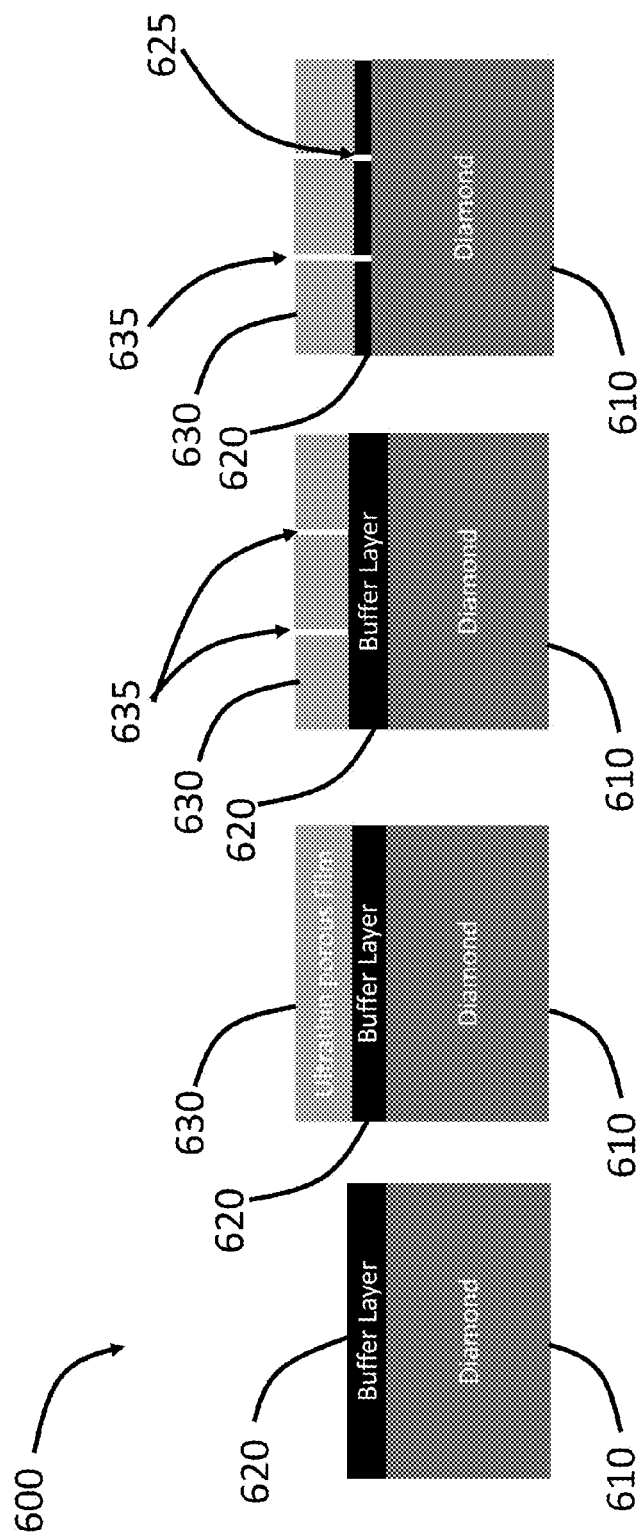

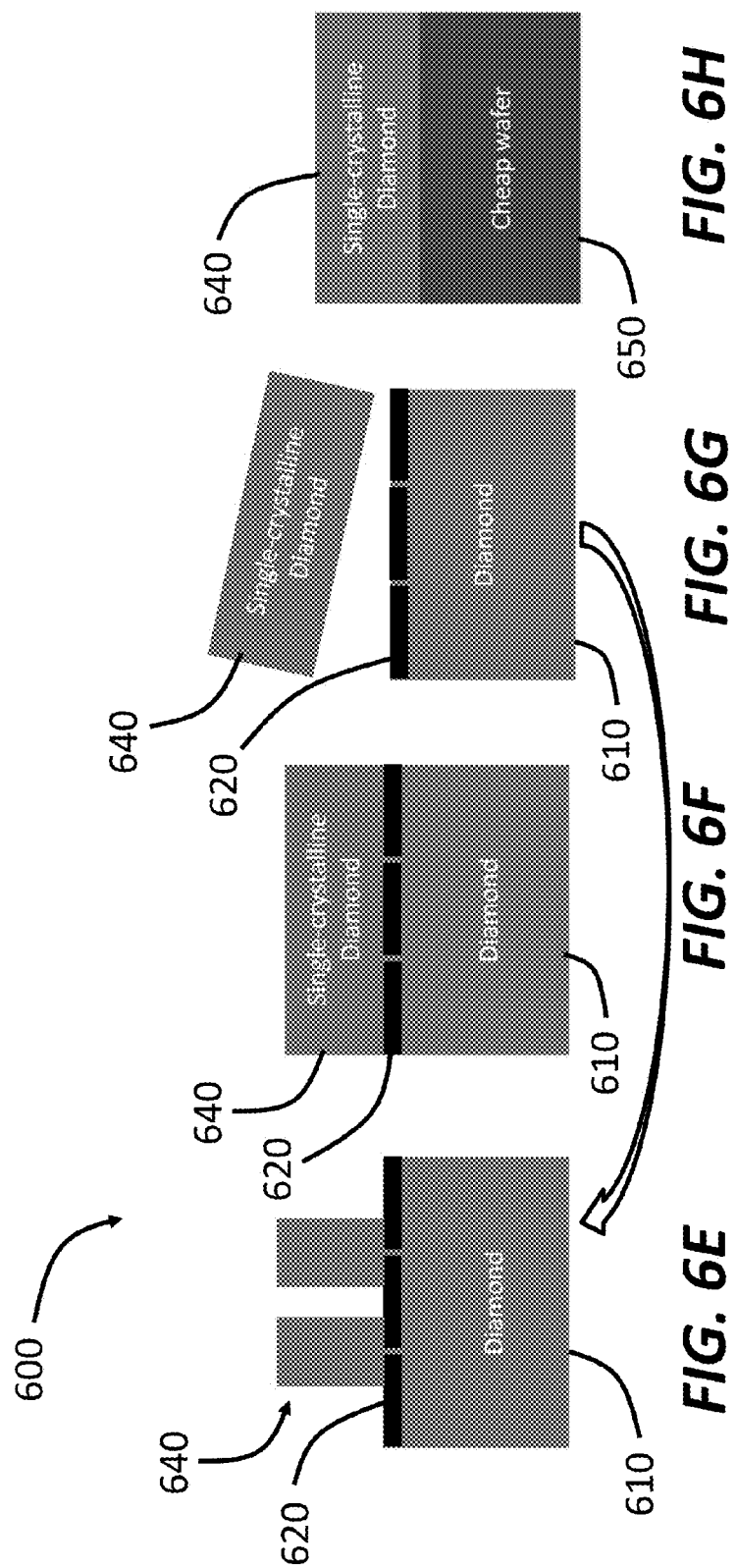

SYSTEMS AND METHODS FOR FABRICATING SINGLE-CRYSTALLINE DIAMOND MEMBRANES

CROSS-REFERENCE TO RELATED APPLICATION

This application claims the priority benefit under 35 U.S.C. § 119(e) of U.S. Application No. 62/345,403, filed Jun. 3, 2016, entitled "METHODS AND APPARATUS FOR PRODUCING SINGLE-CRYSTAL DIAMOND MEMBRANES AND FILMS," which is hereby incorporated herein by reference in its entirety.

GOVERNMENT SUPPORT

This invention was made with Government support under Contract No. FA8721-05-C-0002 awarded by the U.S. Air Force. The Government has certain rights in the invention.

BACKGROUND

Diamond is a wide bandgap semiconductor with an indirect gap of about 5.47 eV, thereby supporting high electric fields before breakdown. High purity chemical vapor deposition (CVD) diamond also has high mobility and long lifetimes for electrons and holes, in addition to high thermal conductivity. These properties make diamond suitable for many applications.

For example, diamond can be used to control power at high voltages due to its wide bandgap. A single diamond switch can be used to switch power at voltages approaching 50 kV, which is challenging for other electronic materials, such as Si and Ge. In another example, diamond can be used for radiation detection, especially in situations where volume sensitivity, radiation hardness, and temperature insensitivity are desired. In contrast to many other solid state radiation detectors, which use reverse biased diodes, high purity intrinsic diamond can act as a solid state ionization chamber at room temperature because charges can travel freely through the lattice of diamond with good purity and crystalline quality.

Currently, diamond membranes (also referred to as diamond films) are usually fabricated via CVD on a non-diamond substrate, such as silicon, tungsten, and titanium. However, the lattice constants of these substrate materials typically do not match the lattice constant of diamond. This lattice constant mismatch can introduce strain into the epitaxial diamond layer, thereby preventing epitaxial growth of thicker diamond layers without defects.

Alternatively, diamond films can also be deposited on a diamond substrate. In this case, one diamond substrate usually fabricates only one diamond membrane so the cost is high. Reuse of diamond substrates can be challenging because it is difficult to remove the fabricated diamond membrane without damaging the surface of the diamond substrate. For example, chemical lift-off as often used in industry can be slow, and the etching residues tend to become surface contamination after release. Another method of removing fabricated diamond layers is the optical lift-off technique, which releases the fabricated diamond membrane via selective heating. However, the heating can roughen the substrate surface and the local pressurization at the membrane-substrate interface caused by high-power thermal irradiation can induce cracks or dislocations.

SUMMARY

Embodiments of the present invention include apparatus, systems, and methods for fabricating diamond membranes and devices. In one example, a method of fabricating a diamond device includes disposing a buffer layer on a diamond substrate and forming a diamond membrane comprising single-crystalline diamond on the buffer layer. The method also includes transferring the diamond membrane from the diamond substrate to a host substrate.

In another example, a method diamond processing includes forming a graphene layer having a thickness substantially equal to or less than 2 nm on a copper foil and transferring the graphene layer from the copper foil to a diamond substrate. The method also includes forming a first single-crystalline diamond membrane on the graphene layer using the diamond substrate as a seed for the single-crystalline diamond membrane and removing the first single-crystalline diamond membrane from the graphene layer. The method also includes forming a second single-crystalline diamond membrane on the graphene layer using the diamond substrate as a seed for the second single-crystalline diamond membrane and removing the second single-crystalline diamond membrane from the graphene layer.

In yet another example, a method of diamond processing includes forming a graphene layer on a first substrate and transferring the graphene layer from the first substrate to a diamond substrate. The method also includes depositing a diamond layer on the graphene layer and depositing a stressor layer on the diamond layer. The stressor layer causes propagation of a crack between the diamond layer and the graphene layer. The method further includes disposing a flexible tape on the stressor layer and pulling the diamond layer and the stressor layer off the graphene layer with the flexible tape.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 1A-1E illustrate a method of diamond membrane fabrication using a buffer layer and mechanical release of the fabricated diamond membrane.

FIGS. 3A-3E illustrate a method of diamond membrane fabrication using graphene as a buffer layer.

FIGS. 5A-5E illustrate a method of reusing a diamond substrate in epitaxial growth of diamond membranes.

FIGS. 6A-6H illustrate a method of fabricating diamond membranes using a porous buffer layer.

DETAILED DESCRIPTION

Figures 2A, 2B, 2C:
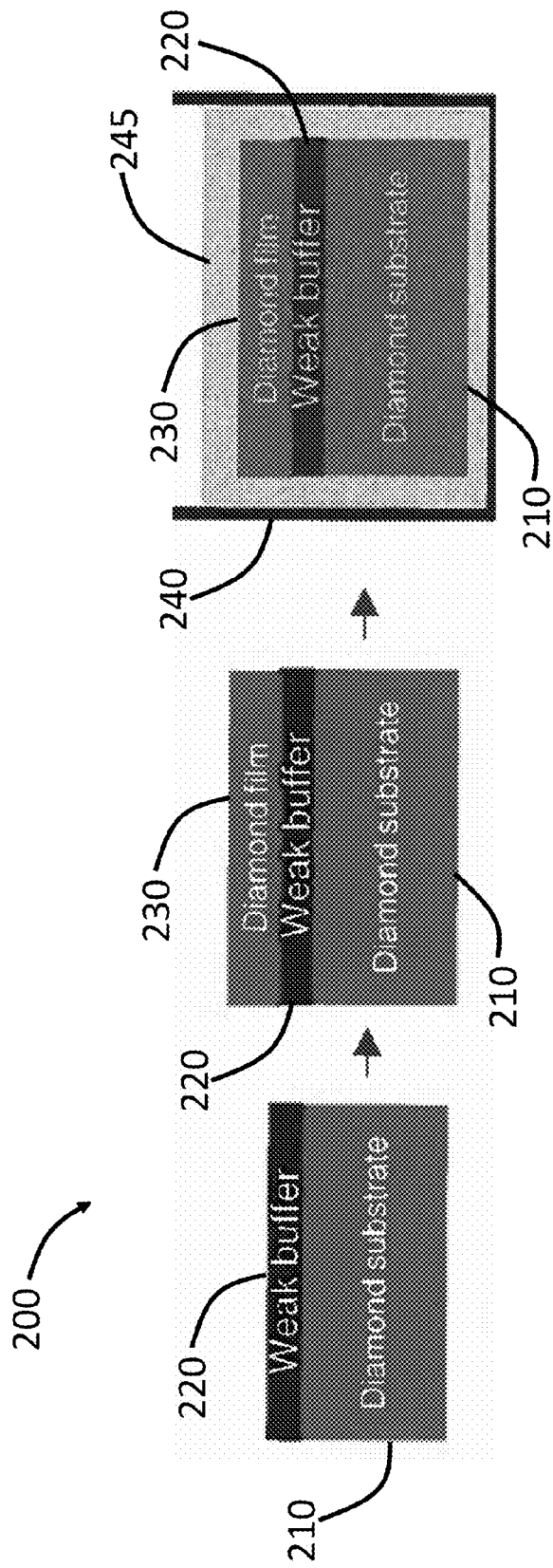
FIGS. 2A-2E illustrate a method of diamond membrane fabrication using a buffer layer and chemical release of the fabricated diamond membrane.

Fabricating Diamond Membranes Using a Buffer Layer

To take advantage of the lattice matching of diamond substrates while controlling the fabrication costs, systems and methods described herein employ a buffer layer to fabricate diamond membranes on diamond substrates. In this approach, diamond membranes are fabricated on a buffer layer, which in turn is disposed on a diamond substrate that is lattice-matched to the diamond membrane. The bonding between the buffer layer and the diamond substrate is usually weaker than the bonding between two diamond layers. Accordingly, the fabricated diamond membranes can be readily removed (e.g., mechanically or chemically) and transferred to another substrate to fabricate diamond devices, while the diamond substrate is reused for another fabrication. In other words, the buffer layer serves as a reusable and universal platform for growing diamond membranes and also serves as a release layer that allows fast, precise, and repeatable release at the diamond membranes.

FIGS. 1A-1E illustrate a method 100 of fabricating diamond membranes using a buffer layer and mechanical release of the fabricated diamond membranes. FIG. 1A shows that a buffer layer 120 is formed or disposed on a diamond substrate 310, which can be a single-crystalline wafer. For example, the buffer layer 120 can include an epitaxial layer directly grown on the diamond substrate 110. Alternatively, the buffer layer 120 can be prepared on another substrate (not shown) and then transferred to the diamond substrate 110. The lattice structure of the buffer layer 120 can be substantially similar to the lattice structure of crystalline diamond so as to reduce the effects of lattice mismatch. In one example, the buffer layer 120 can include silicon. In another example, the buffer layer 120 can include germanium. In yet another example, the buffer layer 120 can include iridium. In yet another example, the buffer layer 120 can include graphene. The graphene used for the buffer layer 120 can be a monolayer of graphene, a bilayer of graphene, or a multilayer of graphene. In addition, more than one layer of graphene monolayers, bilayers, or multilayers can also be used (see more details below with reference to FIGS. 3A-3E).

FIG. 1B shows that a diamond membrane 130 (also referred to as a diamond film or a diamond layer) is epitaxially grown on the buffer layer 120. The growth of the diamond membrane 130 can be realized via, for example, the CVD technique. In some cases, the diamond membrane 130 can include single-crystalline diamond. In one example, the growth of the diamond membrane 130 uses the buffer layer 120 as the seed. Alternatively, the growth of the diamond membrane 130 can use the diamond substrate 110 as the seed. In this case, the thickness of the buffer layer 120 should be substantially equal to or less than 2 nm (e.g., about 2 nm, about 1.8 nm, about 1.6 nm, about 1.4 nm, about 1.2 nm, about 1.0 nm, about 0.9 nm, about 0.8 nm, about 0.7 nm, about 0.6 nm, about 0.5 nm, or less, including any values and sub ranges in between).

FIG. 1C shows that a stressor 140 is disposed on the diamond membrane 130. For example, the stressor 130 can include a high-stress metal film such as a Ni film. In this example, the Ni stressor can be deposited on the diamond membrane 130 in an evaporator at a vacuum level of about $1 \times 10^{-5}$ Torr. In some cases, the thickness of the stressor 140 can be substantially equal to or greater than 400 nm (e.g., about 400 nm, about 450 nm, about 500 nm, about 550 nm, about 600 nm, or greater, including any values and sub ranges in between). In some other cases, the thickness of the stressor 140 can be about 1 µm to about 30 µm (e.g., about 1 about 1 about 2 about 3 about 5 about 10 about 15 about 20 about 25 or about 30 including any values and sub ranges in between. An optional adhesive tape layer (not shown) can be disposed on the stressor 140 for handling the stressor 140. The tape and the stressor 140 are used to mechanically exfoliate the diamond membrane 130 from the buffer layer 120 at a fast release rate by applying high strain energy to the interface between the diamond membrane 130 and the buffer layer 120, as illustrated in FIG. 1D.

In FIG. 1E, the released diamond layer 130 is disposed on a host substrate 150 (also referred to as a host wafer 150). The tape and the stressor 140 are already removed as shown in FIG. 1E, leaving the diamond layer 130 for further processing, such as forming more sophisticated devices (e.g., power electronics, high speed transistors, etc.) or depositing additional materials on the diamond layer 130. In one example, the tape layer and the stressor 140 can be etched away by a $FeCl_3$-based solution. The host substrate 150 can include, for example, silicon, silicon oxides (e.g., $SiO_2$), and silicon nitride (SiN), among others.

In the method 100, after the release of the diamond layer 130 shown in FIG. 1D, the remaining diamond substrate 110 can be reused for another cycle of diamond membrane fabrication. In one example, a new buffer layer 120 can be disposed on the diamond substrate 110 for fabrication of each new diamond membrane 130. The buffer layer 120 can be reused as well. In either case, the buffer layer 120 can protect the diamond substrate 110 from damage, thereby allowing multiple uses and reducing cost. For example, the diamond substrate 110 can be reused for more than 20 times (e.g., more than 20 times, more than 30 times, more than 50 times, more than 100 times, including any values and sub ranges in between).

FIGS. 2A-2E illustrate a method 200 of diamond membrane fabrication using a buffer layer and chemical release of the fabricated diamond membranes. In the method 200, a buffer layer 220 is disposed on a diamond substrate 210 as shown in FIG. 2A. A diamond membrane 230 is grown or deposited on the buffer layer 220, as shown in FIG. 2B. In FIG. 2C, the buffer layer 220 is exposed to an etching solution 245, contained in a container 240, that selectively etches away the buffer layer 220, leaving the diamond membrane 230 disposed on the diamond substrate 210. In one example, the assembly of the diamond substrate 210, the buffer layer 220, and the diamond membrane 230 is immersed in the etching solution 245 (see FIG. 2C). In another example, the etching solution 245 is locally applied to the buffer layer 220 for the etching.

Figures 2D, 2E:
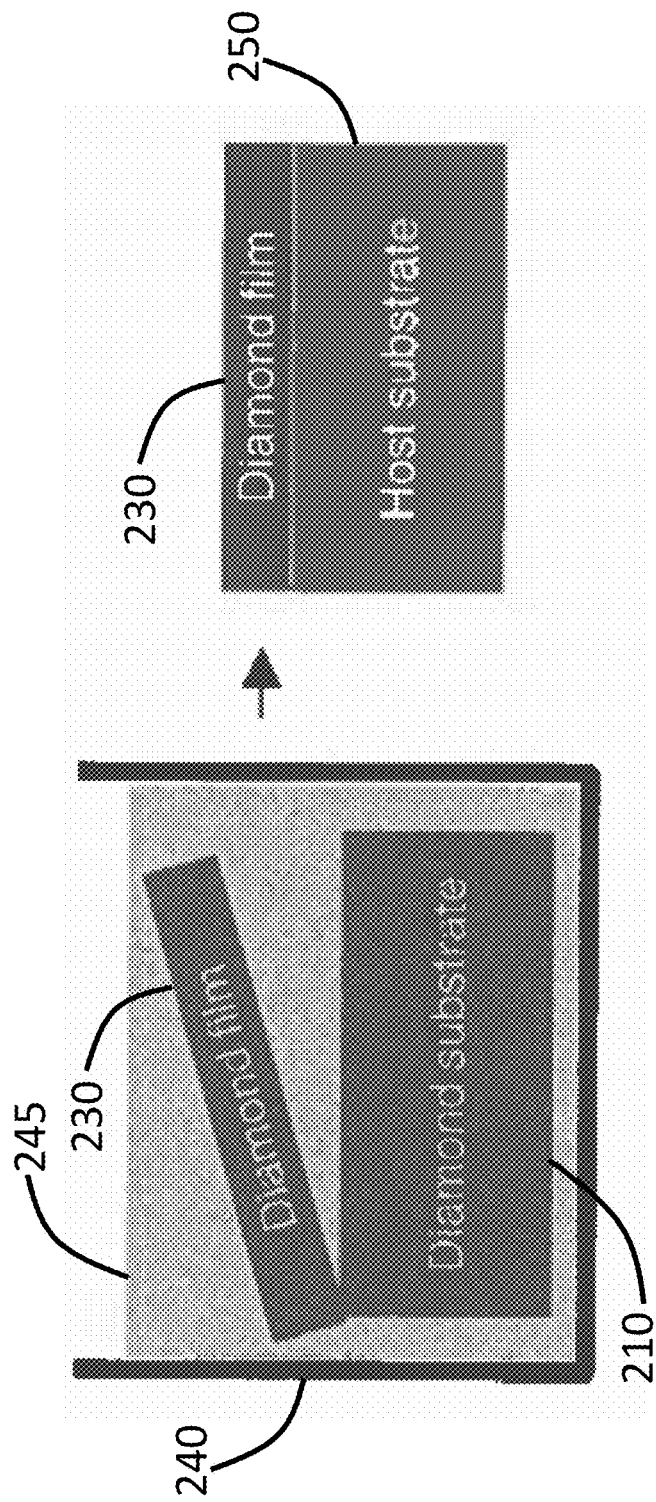

After the buffer 220 has been etched away, the diamond membrane 230 is disposed on the diamond substrate 210. The bonding between the diamond membrane 230 and the diamond substrate 210 is loose enough that the diamond membrane 230 can be readily removed from the diamond substrate 210, as shown in FIG. 2D. The removed diamond membrane 230 is transferred to a host substrate 250 for further fabrication, as shown in FIG. 2E. The transfer of the diamond membrane 230 can be achieved using a stress Ni layer and a tape layer as descried above.

In one example, the buffer layer 220 includes silicon and the etching solution 245 can include KOH and/or Tetramethylammonium hydroxide (TMAH). In another example, the buffer layer 230 includes germanium and the etching solution 245 includes $H_2O_2$.

FIGS. 3A-3E illustrate a method 300 of diamond fabrication using graphene as a buffer layer. Graphene is a crystalline film and is a suitable substrate for growing epitaxial diamond layers for several reasons. First, graphene's weak interaction with other materials substantially relaxes the lattice mismatching rule for epitaxial growth, potentially permitting the growth of diamond membranes with low defect densities. Second, the epilayer (e.g., the diamond membrane) grown on a graphene substrate can be easily and precisely released from the substrate owing to graphene's weak van der Waals interactions, which permits rapid mechanical release of epilayers without post-release reconditioning of the released surface. Third, graphene's mechanical robustness can increase or maximize its reusability for multiple growth/release cycles.

Figures 3D, 3E:
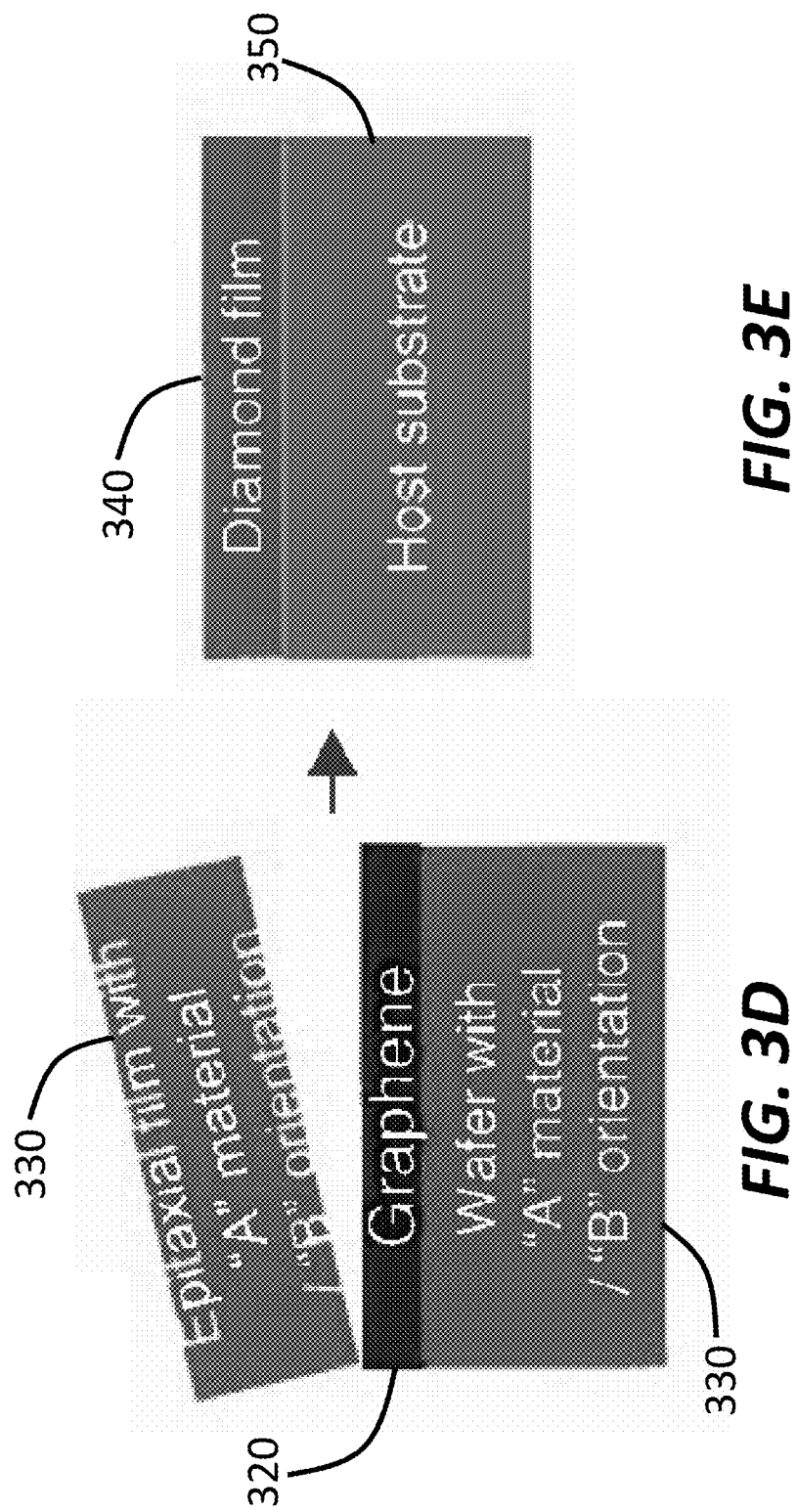

As shown in FIG. 3A, a graphene layer 320 is fabricated on a first substrate 310, such as a Si substrate, SiC substrate, or copper foil. The fabricated graphene layer 320 is removed from the first substrate 310 and then disposed on diamond substrate 330, as shown in FIG. 3B. FIG. 3C shows that a diamond membrane 340 (e.g., a single crystalline diamond layer) is then fabricated on the graphene layer 320. The diamond membrane 340 is then removed from the graphene layer 320, as shown in FIG. 3D, and transferred to a host substrate 350, as shown in FIG. 3E.

The graphene layer 320 can be fabricated on the first substrate 310 via various methods. In one example, the graphene layer 320 can include epitaxial graphene with a single-crystalline orientation and the substrate 310 can include a (0001) 4H—SiC wafer with a silicon surface. The fabrication of the graphene layer 320 can include multiple annealing steps. A first annealing step can be performed in $H_2$ gas for surface etching and vicinalization, and a second annealing step can be performed in Ar for graphitization at high temperature (e.g., about 1,575° C.).

In another example, the graphene layer 320 can be grown on the first substrate 310 via a CVD process. The substrate 310 can include a nickel substrate or a copper substrate. Alternatively, the substrate 310 can include an insulating substrate of $SiO_2$, $HfO_2$, $Al_2O_3$, $Si_3N_4$, and/or practically any other planar material compatible with high temperature CVD processes.

In yet another example, the first substrate 310 can be any substrate that can hold the graphene layer 320, and the fabrication can include a mechanical exfoliation process. In this example, the first substrate 310 can function as a temporary holder for the graphene layer 320.

Various methods can also be used to transfer the graphene layer 320 from the first substrate 310 to the diamond substrate 330. In one example, a carrier film (not shown) can be attached to the graphene layer 320. The carrier film can include a thick film of poly(methyl methacrylate) (PMMA) that is spin-coated onto the graphene layer 320 or a thermal release tape. The thermal release tap may be attached to the graphene layer 320 via mechanical pressing. After the combination of the carrier film and the graphene layer 320 is disposed on the diamond substrate 330, the carrier film can be dissolved (e.g., in acetone) for further fabrication of the diamond membrane 340 on the graphene layer 320.

In another example, a stamp layer (not shown) including an elastomeric material, such as polydimethylsiloxane (PDMS), can be attached to the graphene layer 320. Etching away first substrate 310 leaves the combination of the stamp layer and the graphene layer 320. After the stamp layer and the graphene layer 320 are placed on the diamond substrate 330, the stamp layer can be removed by mechanical detachment, thereby producing a clean surface of the graphene layer 320 to grow the diamond membrane 340.

In yet another example, a self-release transfer method can be used to transfer the graphene layer 320 to the diamond substrate 330. In this method, a self-release layer (not shown) is first spun-cast over the graphene layer 320. The release layer can include polystyrene (PS), poly(isobutylene) (PIB), and/or Teflon AF (poly[4,5-difluoro-2,2-bis (trifluoromethyl)-1,3-dioxole-co-tetrafluoroethylene]). An elastomeric stamp is then placed in conformal contact with the self-release layer. The first substrate 310 can be etched away to leave the combination of the stamp layer, the self-release layer, and the graphene layer 320. After this combination is placed on the diamond substrate 330, the stamp layer can be removed mechanically and the self-release layer can be dissolved under mild conditions in a suitable solvent.

Effects of Substrate Field on the Epilayer

In the method 300 illustrated in FIGS. 3A-3E, the diamond membrane 340 is fabricated on the graphene layer 320. Since graphene typically is on the order of one atom thick (e.g., on the order of 3 Å thick), any covalently bonded substrate surface immediately below the graphene may affect the epitaxial growth of the diamond membrane 340 by, for example, altering the crystalline orientation of the diamond membrane 340. Therefore, it can be beneficial to understand the effect of the underlying diamond substrate 330 on the growth of the diamond membrane 340 so as to, for example, reduce defect density on the diamond membrane 340 as well as to control the properties such as crystalline orientation of the diamond membrane 340.

Figures 4A, 4B:
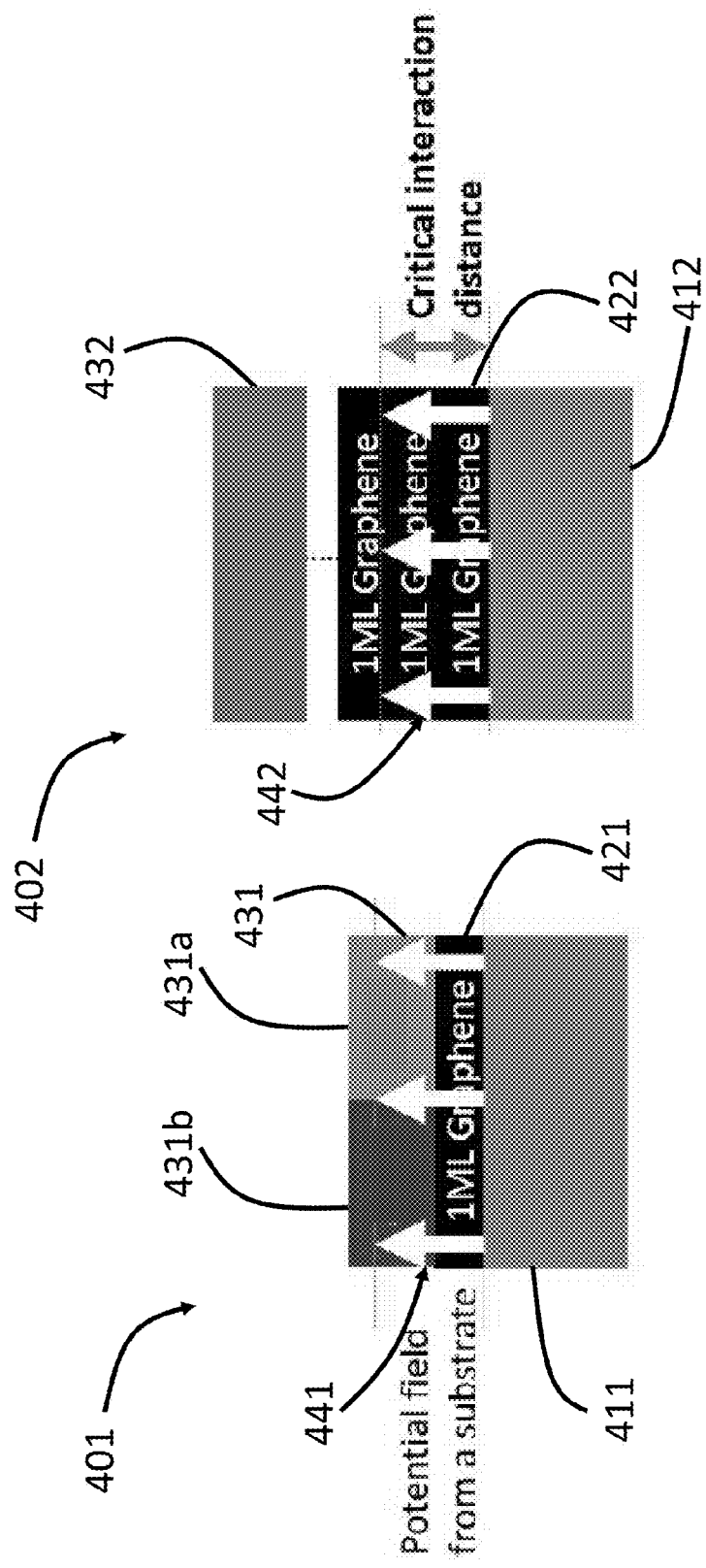
FIG. 4A-4B show the effects of graphene layer thickness and the underlying diamond substrates on the growth of diamond membranes on the graphene layer.

FIGS. 4A-4B show schematics of graphene-based fabrication systems to illustrate the effect of underlying diamond substrates on the growth of diamond membranes. FIG. 4A shows a system 401 including a diamond substrate 411 and a graphene layer 421 disposed on the diamond substrate 411. A diamond membrane 431 is fabricated on the graphene layer 421. The diamond substrate 411 has a potential field 441 (e.g., via van De Waals force or other atomic or molecular forces) indicated by arrows in FIG. 4A. In this case, the graphene layer 421 includes only a single monolayer of graphene (i.e., the graphene layer 421 is one atom thick) and the potential field 441 reaches beyond the graphene layer 421 and can interact with the diamond membrane 431. As a result, the potential field 441, which depends on the material properties (such as crystalline orientation) of the diamond substrate 411, can affect the growth of the diamond membrane 431. At the same time, the graphene layer 421 also has its own potential field (not shown in FIG. 4A), which may similarly influence the growth of the diamond membrane 431. The net result can be that the diamond membrane 431 includes films 431a and 431b having two different orientations such as (100) and (111) orientations. Alternatively, the field 441 from the diamond substrate 411 can be strong enough to overcome graphene field, in which case the diamond membrane 431 can include single-crystalline structures that resemble the diamond substrate 411.

FIG. 4B shows a system 402 including a diamond substrate 412 and a graphene layer 422 disposed on the diamond substrate 412. A diamond membrane 432 is fabricated on the graphene layer 422. The diamond substrate 412 has a potential field 442 indicated by arrows in FIG. 4B. In contrast to the graphene layer 421 in FIG. 4A, the graphene layer 422 in FIG. 4B includes multiple stacks of monolayer graphene (i.e., the graphene layer 422 is more than one atom thick). Accordingly, the potential field 442 may interact only with the graphene layer 422 and may not reach the device layer 432. In other words, the growth of the diamond membrane 432 occurs outside the potential field 442 of the diamond substrate 412. In this case, the potential field of the graphene layer 422 affects the growth of the diamond membrane 432.

FIGS. 4A-4B show that the effect of the diamond substrate (e.g., 411 and 412) on the growth of the diamond membrane (e.g., 431 and 432) depends on the distance between them. In other words, the thickness of the graphene layer (e.g., 421 and 422) sandwiched between the substrate and the diamond membrane determines the interaction strength. Beyond a critical distance, the underlying diamond substrate may not have any effect on the epitaxial growth of the diamond membrane. In some cases, this critical distance can be about 0.5 nm to about 3 nm (e.g., about 0.5 nm, about 0.6 nm, about 0.7 nm, about 0.8 nm, about 0.9 nm, about 1.0 nm, about 1.2 nm, about 1.4 nm, about 1.6 nm, about 1.8 nm, about 2.0 nm, about 2.2 nm, about 2.4 nm, about 2.6 nm, about 2.8 nm, or about 3 nm, including any values and sub ranges in between).

Reuse of Diamond Substrates in Epitaxial Growth of Diamond Membranes

FIGS. 5A-5E illustrate a method 500 of reusing diamond substrates in epitaxial growth of diamond membranes. In this method 500, graphene is used in the buffer layer 520, but other materials, such as silicon, germanium, and iridium, can be used instead. In FIG. 5A, a donor wafer 510a is provided to grow a graphene layer 520 (shown in FIG. 5B). FIG. 5B shows that the graphene layer 520 is then transferred to a diamond wafer 510b. In FIG. 5C, a diamond membrane 530 is grown epitaxially above the graphene layer 520. Since the graphene layer 520 is sufficiently thin in this case, the growth of the diamond membrane 530 is seeded by the diamond wafer 510b underneath the graphene layer 520. In FIG. 5D, a stressor 540 is deposited on the diamond membrane 530 to facilitate subsequent layer transfer. The stressor 540 can include high stress metal materials such as nickel. In FIG. 5E, a tape layer 550 is disposed on the stressor 540 so as to handle the stressor 540 for releasing the diamond membrane 530 from the graphene layer 520 and the diamond wafer 510b.

In the method 500, the graphene layer 520 is thin enough that the graphene seeding effect disappears or is overshadowed by the stronger substrate seeding effect. After the release of the diamond membrane 530, the remaining graphene layer 520 and the diamond wafer 510b can be used for another round of diamond membrane fabrication, i.e., the method 500 proceeds back to FIG. 5B to grow a second diamond membrane 520, which is removed and transferred again as in FIGS. 5C-5E. In this manner, the diamond wafer 510b can be reused for multiple times, thereby reducing the total costs of fabrication. In addition, the graphene layer 520 may also be reused. Alternatively, a new graphene layer 520 can be prepared for each diamond membrane 530. In yet another example, the quality of the graphene layer 520 can be monitored. In the event of detecting damages on the graphene layer 520, a new graphene layer 520 can be used.

Fabrication of Diamond Membrane Using a Porous Buffer Layer

FIGS. 6A-6H illustrate a method 600 of fabricating diamond membranes using a porous buffer layer. A porous buffer layer includes a buffer layer (e.g., 120 and 220) patterned with periodic or aperiodic holes. The porous buffer layer can facilitate interaction between the diamond substrate and the diamond membrane, thereby allowing the diamond substrate to seed the growth of the single-crystalline diamond membrane.

In FIG. 6A, a buffer 620 is disposed on a diamond substrate 610. The buffer layer 620 can be grown on the diamond substrate 610 via, for example, chemical vapor deposition. Alternatively, the buffer layer 620 can be transferred to the diamond substrate 610, e.g., from another substrate. A porous film 630 (e.g., oxide, nitride, or photoresist film) is then disposed on the buffer layer 620 as shown in FIG. 6B. The porous film 630 has a high density of pinholes (e.g., about one hole per square micron). Alternatively, the porous film 630 can include any film with holes to allow subsequent processing shown in FIGS. 6C-6H.

In FIG. 6C, dry etching using Ar plasma or $O_2$ plasma is carried out to open up the pinholes in the porous film 630. This etching creates a plurality of holes 635 in the porous film 630, allowing the ions in the etching plasma to propagate through the porous film 630 to the buffer layer 620. The etching plasma then etches the portion of the buffer layer 620 directly underneath the pinholes 635 in the porous film 630. Ions in the etching plasma can damage the buffer layer 620 by creating a plurality of holes 625 in the buffer layer 620, which now becomes a porous buffer layer 620. In one example, the etching of the porous film 630 and the etching of the porous buffer layer 620 can be achieved with the same etching plasma. In another example, the etching of the porous film 630 and the etching of the buffer layer 620 can be achieved with different etching plasmas.

In FIG. 6E, the porous film 630 is removed, leaving the now-porous buffer layer 620 exposed to further processing. In one example, the porous film 630 includes photoresist material and can be removed by acetone. In another example, the porous film 630 includes oxide or nitride and can be removed by hydrogen fluoride (HF). FIG. 6E also shows that a diamond membrane 640 is grown on the porous buffer layer 620. The growth starts from the area where the holes 625 were created. The holes 625 allow direct interaction of the diamond substrate 610 with the diamond membrane 640, thereby allowing the diamond substrate 610 to guide the crystalline orientation of the diamond membrane 640. The growth of the diamond membrane 640 then extends to cover the entire buffer layer 620, forming a planar diamond membrane 640.

In FIG. 6G, the formed diamond membrane 640 is released from the buffer layer 620 and the diamond substrate 610. The released diamond membrane 640 is transferred to a target substrate 650, as shown in FIG. 6H, for further processing, such as forming a functional device. The buffer layer 620 and the diamond substrate 610, after the release of the diamond membrane 640 shown in FIG. 6G, is then reused to fabricate another diamond epilayer, and the cycle can be repeated multiple times.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of" "only one of" or "exactly one of". "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method of fabricating a diamond device, the method comprising:
   disposing a buffer layer on a diamond substrate;
   forming a diamond membrane comprising single-crystalline diamond on the buffer layer; and
   transferring the diamond membrane from the diamond substrate to a host substrate.

2. The method of claim 1, wherein disposing the buffer layer comprises disposing a graphene layer on the diamond substrate.

3. The method of claim 2, wherein disposing the graphene layer comprises disposing a single-crystalline graphene layer.

4. The method of claim 2, wherein disposing the graphene layer comprises:
   forming the graphene layer on a copper foil; and
   transferring the graphene layer from the copper foil to the diamond substrate.

5. The method of claim 2, wherein the graphene layer comprises more than one layer of graphene and forming the diamond membrane comprises using the graphene layer as a seed for the diamond membrane.

6. The method of claim 5, wherein the graphene layer has a thickness greater than 8.5 Å.

7. The method of claim 2, wherein the graphene layer consists of a single layer of graphene and forming the diamond membrane on the graphene layer comprises using the diamond substrate as a seed for the diamond membrane and using the graphene layer as a release layer.

8. The method of claim 1, wherein transferring the diamond membrane comprises:
   forming a stressor layer on the diamond membrane;

pulling the stressor layer and the diamond membrane off the buffer layer; and disposing the stressor layer and the diamond membrane on the host substrate.

9. The method of claim 8, further comprising:
removing the stressor layer via etching.

10. The method of claim 8, wherein the stressor layer comprises nickel.

11. The method of claim 8, wherein the stressor layer has a thickness of about 1 µm to about 30 µm.

12. The method of claim 1, wherein the buffer comprises at least one of silicon or germanium, and transferring the diamond membrane comprises:

etching away the buffer layer to release the diamond membrane; and disposing the diamond membrane to the host substrate.

13. The method of claim 12, wherein etching away the buffer layer comprises exposing the buffer layer to an etching solution comprising at least one of KOH or Tetramethylammonium hydroxide (TMAH).

14. A device formed by the method of claim 1.

15. A method of diamond processing, the method comprising:

forming a graphene layer having a thickness substantially equal to or less than 2 nm on a copper foil;

transferring the graphene layer from the copper foil to a diamond substrate;

forming a first single-crystalline diamond membrane on the graphene layer using the diamond substrate as a seed for the single-crystalline diamond membrane;

removing the first single-crystalline diamond membrane from the graphene layer;

forming a second single-crystalline diamond membrane on the graphene layer using the diamond substrate as a seed for the second single-crystalline diamond membrane; and removing the second single-crystalline diamond membrane from the graphene layer.

16. The method of claim 15, wherein removing the first single-crystalline diamond membrane comprises exfoliating the first single-crystalline diamond membrane.

17. A device formed by the method of claim 15.

18. A method of diamond processing, the method comprising:

forming a graphene layer on a first substrate;

transferring the graphene layer from the first substrate to a diamond substrate;

depositing a diamond layer on the graphene layer;

depositing a stressor layer on the diamond layer, the stressor layer causing propagation of a crack between the diamond layer and the graphene layer; and disposing a flexible tape on the stressor layer; and pulling the diamond layer and the stressor layer off the graphene layer with the flexible tape.

* * * * *